(12) United States Patent
Kawada et al.

(10) Patent No.: US 8,124,510 B2
(45) Date of Patent: Feb. 28, 2012

(54) METHOD OF MANUFACTURING A SILICON CARBIDE SEMICONDUCTOR DEVICE

(75) Inventors: Yasuyuki Kawada, Matsumoto (JP); Takeshi Tawara, Matsumoto (JP)

(73) Assignee: Fuji Electric Co., Ltd. (JP)

( * ) Notice: Subject to any disclaimer, the term of this patent is extended or adjusted under 35 U.S.C. 154(b) by 1 day.

(21) Appl. No.: 12/767,899

(22) Filed: Apr. 27, 2010

(65) Prior Publication Data

US 2011/0070723 A1 Mar. 24, 2011

(30) Foreign Application Priority Data

Apr. 27, 2009 (JP) ................................. 2009-108119

(51) Int. Cl.
*H01L 21/265* (2006.01)
(52) U.S. Cl. ........ 438/522; 438/689; 438/795; 438/796; 257/E21.06; 257/E21.065
(58) Field of Classification Search .................. 438/522, 438/689, 795, 796; 257/E21.06, E21.065, 257/E21.182, E21.226
See application file for complete search history.

(56) References Cited

U.S. PATENT DOCUMENTS

| | | | | |
|---|---|---|---|---|
| 5,571,374 | A * | 11/1996 | Thero et al. | 438/718 |
| 2004/0183128 | A1 | 9/2004 | Muraoka et al. | |
| 2005/0233539 | A1* | 10/2005 | Takeuchi et al. | 438/400 |
| 2008/0220620 | A1* | 9/2008 | Kawada et al. | 438/795 |

FOREIGN PATENT DOCUMENTS

| | | | |
|---|---|---|---|
| JP | 2001-168329 | A | 6/2001 |
| JP | 2001-332727 | A | 11/2001 |
| JP | 2003-188379 | A | 7/2003 |
| JP | 4130356 | A | 8/2008 |

* cited by examiner

*Primary Examiner* — Charles Garber
*Assistant Examiner* — Abdulfattah Mustapha
(74) *Attorney, Agent, or Firm* — Rossi, Kimms & McDowell LLP (57) ABSTRACT

A method of manufacturing a silicon carbide semiconductor device is disclosed in which a trench and a hole are controlled to have a predetermined configuration even if the silicon carbide semiconductor device is subjected to a heat treatment at a temperature of not lower than 1,500° C. A heat treatment step(s) of a method of the invention includes a step of heat treatment in an argon atmosphere at a temperature in a range of 1,600° C. to 1,800° C. under a pressure of at most 10 Torr for a time duration in a range of 0.1 min to 10 min to evaporate silicon atoms from a surface of the silicon carbide semiconductor substrate or the silicon carbide epitaxial layer and to obtain a silicon carbide surface with a carbon atom concentration of at least 95%. The method can further comprise a step of ion implantation of nitrogen ions or phosphorus ions in a dose amount of $8\times10^{14}$ cm$^{-2}$ into a surface of the silicon carbide semiconductor substrate or into the silicon carbide epitaxial layer, followed by the step of heat treatment at a temperature of 1,500° C. or higher. The method can comprise a step of heat treatment in an atmosphere of argon gas at a temperature in a range of 1,600° C. to 1,800° C. containing monosilane in an amount of at least 0.2%.

3 Claims, 11 Drawing Sheets

— Annealing Only

— Radius of Curvature 1.42 $\mu m^{-1}$

Fig. 3c

— Annealing
— Annealing

— Radius of Curvature 0.95 $\mu m^{-1}$

FIG. 4a

Without Implantation

Radius of Curvature 0.47 $\mu m^{-1}$

FIG. 4b

Radius of Curvature 0.67 $\mu m^{-1}$

FIG. 4c

Radius of Curvature 0.88 $\mu m^{-1}$

FIG. 5

Graphitization

FIG. 6

Annealing (Argon Only)

Graphitization+SiH$_4$-0% Annealing

FIG. 12

Graphitization+SiH$_4$-0.26% Annealing

Radius of Curvature 0.53 μm

METHOD OF MANUFACTURING A SILICON CARBIDE SEMICONDUCTOR DEVICE

BACKGROUND OF THE INVENTION

A. Field of the Invention

This application is based on, and claims priority to, Japanese Patent Application No. 2009-108119, filed on Apr. 27, 2009, the entire contents of which are incorporated herein by reference.

B. Description of the Related Art

The present invention relates to a method of manufacturing a silicon carbide semiconductor device and in particular to a method of manufacturing a silicon carbide semiconductor device having a structure of a trench or a hole.

A semiconductor device of a MOSFET (metal oxide semiconductor field effect transistor) or an IGBT (insulated gate bipolar transistor) has trenches with a shape of a straight line formed in a stripe pattern from the surface of the semiconductor substrate. In the case of a MOSFET with a super junction structure, the trench is formed in a rectangular or circular shape in place of the stripe pattern. In another case, a hole is formed to take contact with one of the laminated semiconductor regions.

In a semiconductor device having a trench structure with a shape of a straight line in particular, electric field concentration occurs at an end of the trench when a high voltage is applied to the semiconductor device. Electric field concentration is also apt to occur at an end of the trench when the end of the trench has become a sharp edge in a dry etching process. If the electric field concentration occurs at the end of the trench exceeding a withstand voltage, the semiconductor device may be broken down.

Figure 13:
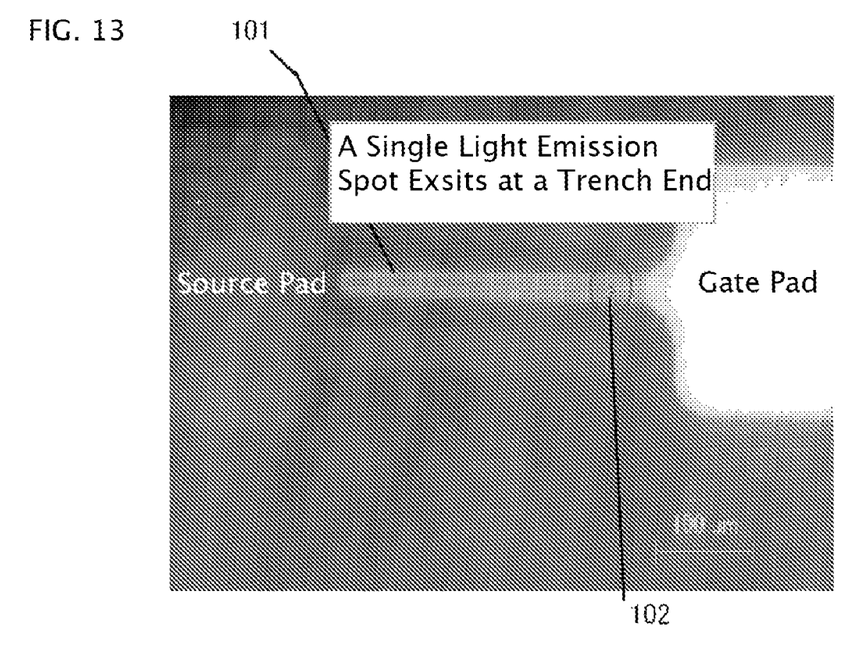
FIG. 13 is an electron micrograph showing a result of leak analysis on a conventional MOSFET having a trench structure.

FIG. 13 is an electron micrograph showing a result of leak analysis on a conventional MOSFET having a trench structure. An emission microscope (EMS) is used for observation of the MOSFET. The MOSFET of FIG. 13 is provided with trench 101 with a linear shape in the semiconductor device using a silicon carbide (SiC) semiconductor substrate. (This device is referred to as an SiC semiconductor device in the following description. In FIG. 13, light emission due to electric current leakage is observed at the end 102 of the trench (encircled part). Such a part of light emission is liable to generate electric field concentration and brings about break down.

In order to avoid the above-described problem in the case of a semiconductor device using a silicon semiconductor substrate, techniques are known to form the end of the trench rounded and to the end by connecting the ends of the trenches.

A semiconductor device with a trench structure has been disclosed in Japanese Unexamined Patent Application Publication No. 2003-188379, for example, in which the end of the trench is rounded. The semiconductor device of this document has a planar configuration with a width in a vicinity of the end narrower than that in a body part near the center. The part around the end is formed shallower than that of the body part by a dry etching process and the corner part of the trench end is rounded. This configuration eliminates a singular point at the corner part of the trench end in a gate oxide film and a gate electrode to mitigate or vanish the electric field concentration to the corner part of the trench end, thus avoiding degradation of a withstand voltage at the corner part of the trench end.

Japanese Patent No. 4130356 discloses a semiconductor device comprising, in a first cell region and a second cell region adjacent to each other of a semiconductor layer formed in a semiconductor substrate: a plurality of trench lines with a stripe pattern formed in a parallel with each other along a positive direction, the positive direction being defined by a direction directing from the first cell region towards the second cell region through the boundary between the first cell region and the second cell region; a first connecting trench partly connecting two adjacent first ends of the trench lines in the positive direction; a second connecting trench partly connecting two adjacent second ends positioned oppositely to the first end; gate insulation films formed in the trench line and in the first and second connecting trenches; gate electrodes embedded in the trench line and in the first and second connecting tranches through the gate insulation films; a gate wiring formed on the semiconductor layer at the boundary between the first cell region and the second cell region and electrically connecting to the gate electrodes; a first electrode formed on the semiconductor layer between the adjacent trench lines; and a second electrode formed on a surface of the semiconductor substrate opposite to the semiconductor layer; wherein at least one of the first connecting trenches in the first cell region does not face to the second connecting trench in the second cell region.

Japanese Unexamined Patent Application Publication No. 2001-168329 discloses a semiconductor device having a trench structure with adjacent trenches connected by a U-shaped curved part, in which a connecting part with a large radius of curvature is formed connecting an end of the trench directing towards a tip end and one end of the adjacent trenches, the connecting part being provided in a p well region.

Japanese Unexamined Patent Application Publication No. 2001-332727 discloses another semiconductor device having a trench structure with adjacent trenches connected by a U-shaped curved part, in which a connecting part with a width larger than that of the straight line portion of the trench is formed connecting an end of the trench directing towards a tip end and an end of the adjacent trenches.

Figure 14:
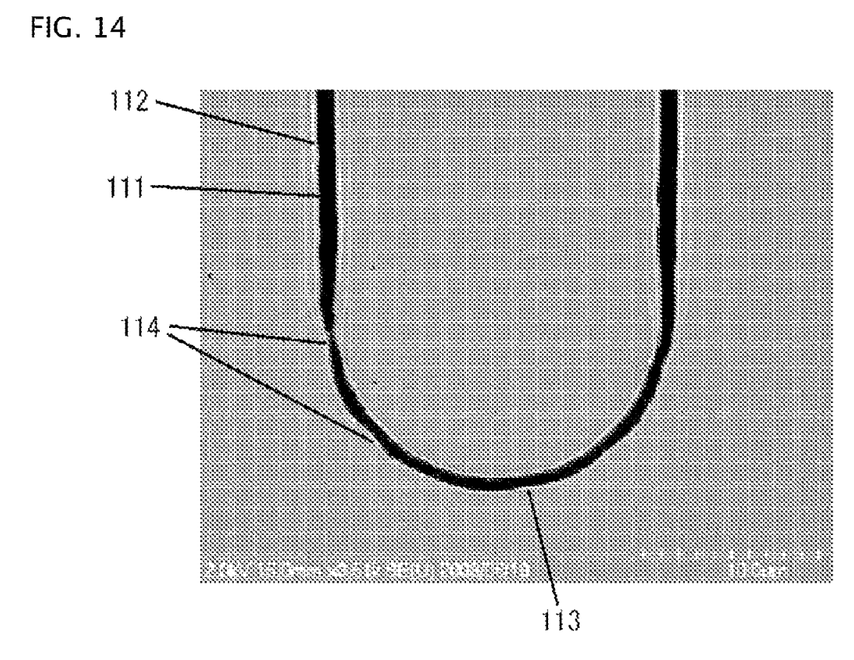
FIG. 14 is an electron micrograph observed directing towards the surface of a conventional silicon carbide semiconductor device before heat treatment.

However, it has been found through extensive studies by the inventors of the present invention that the following problem would result if the above-described technologies are applied to the SiC semiconductor devices. A description will be made on the case of the technology of Japanese Unexamined Patent Application Publication No. 2001-168329 applied to an SiC semiconductor device. FIG. 14 is an electron micrograph observed from the front surface side of a conventional silicon carbide semiconductor device before heat treatment. The observation on the SiC semiconductor device was carried out using a scanning electron microscope (SEM). The same SEM was used for taking the pictures of FIG. 1 and FIGS. 3 through 16. The SiC semiconductor device of FIG. 14 has trench 111 formed in the surface layer thereof. Trench 111 is composed of adjacent trenches 112 with the shape of a straight line (referred to as a straight line portion of a trench in the following description) and connection portion 113 that connects the ends of straight line portions 112 of the trenches with a semicircular line.

Trench 111 of the SiC semiconductor device shown in FIG. 14 is formed by dry etching. The connecting portion 113 of the trench is confirmed to include parts with a narrowed trench width and parts with an irregular configuration in the side wall of the trench; those parts are referred to as defective trench etching configuration 114. The defective trench etching configuration 114 can be assumed to be generated due to difference in the dry etching speed depending on the crystal plane of the semiconductor device (crystal plane orientation dependence).

Figure 15:
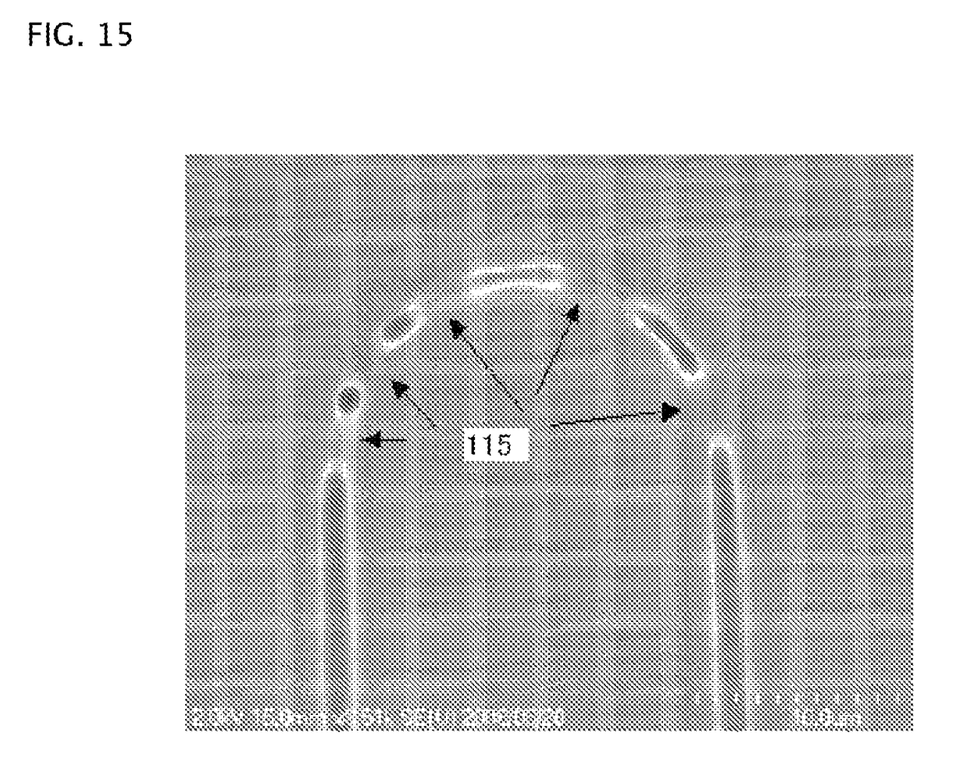
FIG. 15 is an electron micrograph observed directing towards the surface of a conventional silicon carbide semiconductor device before heat treatment.

FIG. 15 is an electron micrograph observed from the front surface side of a conventional silicon carbide semiconductor device after heat treatment. The heat treatment was conducted in an argon gas flow with an additive of monosilane (SiH$_4$) in a flow rate fraction of 0.4%, under a pressure of 80 Torr at a temperature of 1,700° C. for 60 minutes. A focused ion beam apparatus (FIB) was used in the observation of the SiC semiconductor device, which is also applicable in the following. The heat treatment subjected to the SiC semiconductor device is confirmed to create the parts of filled trench in portions of connection portion 113 of the trench (referred to as defective trench formation 115).

A configuration of the defective trench formation portion 115 was observed by cutting out a cross section of the SiC semiconductor device.

In the process of manufacturing a semiconductor device with a trench structure, a heat treatment is conducted, after forming the trench, on the semiconductor device at a temperature at least 1,500° C. for improving a trench configuration and activation after ion implantation, for example. As described above, such a heat treatment subjected to an SiC semiconductor device generates deformation such as narrowed trench width and shallower trench in some parts of the trench connection portion. It has been further found that a degree of the deformation of the narrowed trench width and shallower trench depth by the heat treatment in the trench connection portion and places of such deformation differs depending on a radius of curvature of the trench connection portion. The radius of curvature of the trench connection portion is determined by a cell pitch of the trench straight portions. It has been clarified that various cell pitches generate various degree of irregularities on various parts of the side wall and the bottom surface of the trench connection portion depending on the magnitude of the cell pitch. If a part of the trench connection portion narrowed in the trench etching process is further narrowed or shallower due to a heat treatment process, the part of the trench connection portion would be filled out. If the irregularities created due to the heat treatment deform greatly the trench connection portion, the irregularity itself becomes a defective trench formation part.

Thus, a part of the trench connection portion may be buried in an SiC semiconductor device due to a heat treatment process at a temperature of not lower than 1,500° C. notwithstanding the connection with the trench connection portion between the straight line portions of the trenches. If a part of the trench connection portion is buried, an end is created in the trench or an end of the trench becomes an acute shape. As a result, the electric field concentration occurs at the end part of the trench, degrading the SiC semiconductor device or even breaking the device.

Figure 16:
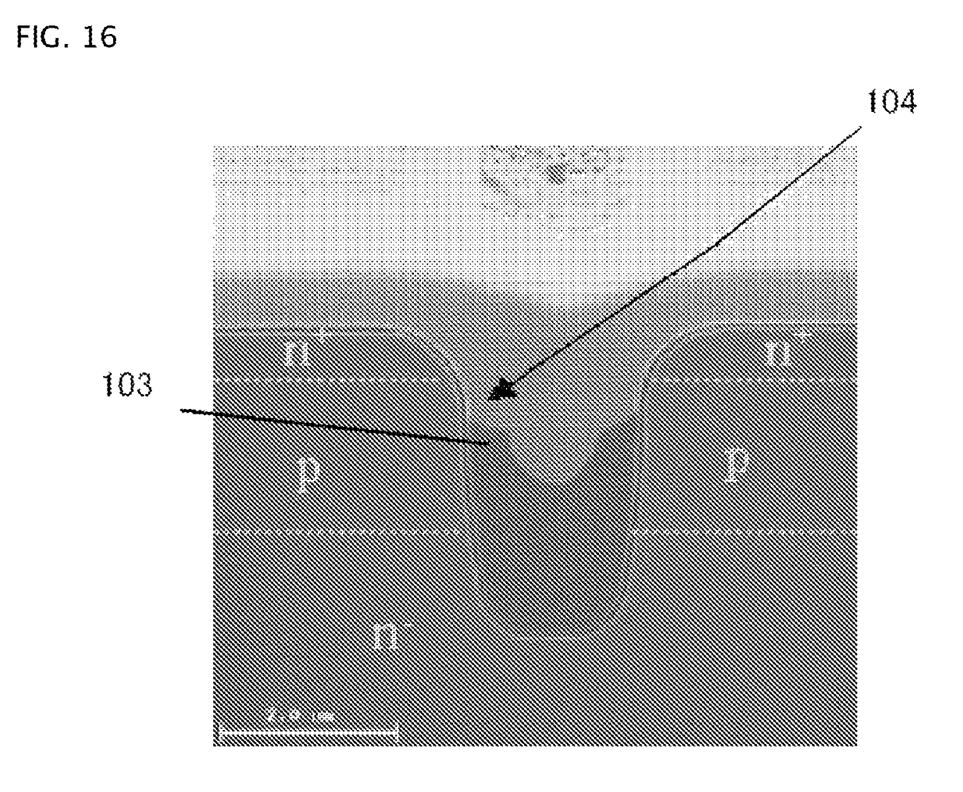
FIG. 16 is an electron micrograph of a cross section of a conventional silicon carbide semiconductor device.

In order to mitigate the electric field concentration, a corner of an opening part of the trench needs to be rounded. If a radius of curvature of the rounded corner is excessively large, it is difficult to control an amount of dry etching of polycrystalline silicon from the surfaced position of the trench opening to the minimum in the polysilicon electrode (a gate electrode) filled in the trench. A large radius of curvature at the corner of a trench requires a large amount of etched polysilicon from the trench opening. In an extreme case as shown in FIG. 16, a region 104 is created in which the top surface position of the polysilicon electrode 103 does not reach the bottom surface position of the n+ region, causing failure of channel inversion in the p region making the device inoperative. FIG. 16 is an electron micrograph of a silicon carbide semiconductor device with a large radius of curvature at the corner of the trench opening observed from a cross sectional direction.

The present invention is directed to overcoming or at least reducing the effects of one or more of the problems set forth above.

SUMMARY OF THE INVENTION

The invention provides a method of suppressing and a method of promoting deformation at the corner of the trench opening and to provide a method of controlling an etching configuration of silicon carbide.

The invention also solves above-described problems of the conventional technologies and provides a method of manufacturing a silicon carbide semiconductor device with reduced defective products.

To solve the problems, a method of manufacturing a silicon carbide semiconductor device according to the invention has the following feature. A manufacturing method for suppressing deformation at a corner of the trench opening of silicon carbide suppresses deformation of an etching configuration of silicon carbide by a heat treatment in an argon atmosphere at a temperature in a range of 1,600° C. to 1,800° C. under a pressure of at most 10 Torr for 0.1 to 10 minutes to evaporate silicon atoms from a surface of the silicon carbide and obtain the silicon carbide surface with a carbon atom composition of at least 95%.

A method of manufacturing a silicon carbide semiconductor device according to the invention promotes deformation of an etching configuration of silicon carbide by injecting ions of nitrogen or phosphorus in a dose amount of $8 \times 10^{14}$ cm$^{-2}$ onto the silicon carbide surface and then heat treating at a temperature at a temperature not lower than 1,500° C.

A method of manufacturing a silicon carbide semiconductor device according to the invention promotes deformation of an SiC etching configuration by heat treating in an atmosphere of argon gas at a temperature in a range of 1,600° C. to 1,800° C. containing monosilane SiH$_4$) in a composition of at least 0.2%.

In the representation of the Miller indices used in this specification and accompanying drawings, the sign "-" is a bar for the following index and means a negative index.

According to the method of manufacturing a silicon carbide semiconductor device of the invention, a trench and a hole are controlled to have a predetermined configuration even if the silicon carbide semiconductor device is subjected to a heat treatment at a temperature of not lower than 1,500° C.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Now, some preferred embodiments according to a method of manufacturing a silicon carbide semiconductor device according to the present invention will be described in detail in the flowing with reference to accompanying drawings. In the following description of the embodiments and accompanying drawings, the similar structure is given the same symbol and repeated description is eliminated. The silicon carbide in the following description has a crystal lattice of hexagonal structure with four layers (4H—SiC) unless otherwise specified.

FIG. 1 is an electron micrograph of a surface of a silicon carbide semiconductor device of the First Embodiment. The silicon carbide (SiC) semiconductor device of FIG. 1 is provided with a trench 1 in the surface layer of an SiC single crystal substrate or an SiC single crystal substrate with an SiC epitaxial film laminated on the surface thereof, for example. These substrates are referred to as SiC substrates in the following description.

A substrate having a crystal structure of 4H—SiC with an 8 degrees off C plane (or a substrate of 4H—SiC with an 8 degrees off C plane having an SiC epitaxial film) is cleaned thoroughly to remove foreign particles and organic substances adhered on the surface of the SiC substrate. Then, a silicon dioxide ($SiO_2$) film 2.5 µm thick is deposited on a (0001) e-C plane of the SiC substrate by means of a plasma CVD method (plasma enhanced chemical vapor deposition method: PECVD method).

The deposition was conducted using a deposition gas of monosilane ($SiH_4$)+oxygen+argon, under a pressure of 50 Pa with 500 W of VHF (very high frequency) power at 60 MHz at a substrate heating temperature of 400° C. After cleaning the deposited substrate, a resist is applied on the $SiO_2$ film using a coater. After that, an exposure process was conducted using a reticle having a pattern of trenches, circles, and hexagons by means of a stepper apparatus. A development process was conducted after the exposure process. Precise patterning was checked using a microscope. Then, a baking process was further conducted at 143° C. for 1 minute using a coater-developer in order to improve resistance to RIE etching of the resist. A thickness of the resist was about 2.5 µm.

Then, a dry etching process was conducted on the $SiO_2$ film using a mask of the resist by means of a reactive ion etching (RIE) apparatus. Etching conditions were: an etching gas of a mixed gas of trifluoromethane ($CHF_3$)/argon=10/10 sccm, a pressure of 3 Pa, and an RF power of 75 W. An ashing process was conducted after the etching process to remove the remained resist, in the conditions of: mixed gas of $CHF_3$/$O_2$=4/100 sccm, a pressure of 150 Pa, and an RF power of 150 W. After the ashing process, the resist was immersed in a stripper solution to thoroughly remove the resist, the substrate was immersed in isopropyl alcohol, washed with pure water, and dried.

The thus fabricated $SiO_2$ pattern was used for dry etching the SiC. The etching process on the SiC was carried out using an SiC etching apparatus utilizing inductively coupled plasma (ICP) in the etching conditions of ICP power of 450 W, bias power of 8 W, an etching gas of sulfur hexafluoride ($SF_6$)/oxygen/argon=8.5/1.5/50 sccm, and a pressure of 2 Pa. Etching depth was in the range from 3.5 µm to 4.5 µm. After the etching process, the remaining $SiO_2$ film was removed.

Figure 2:
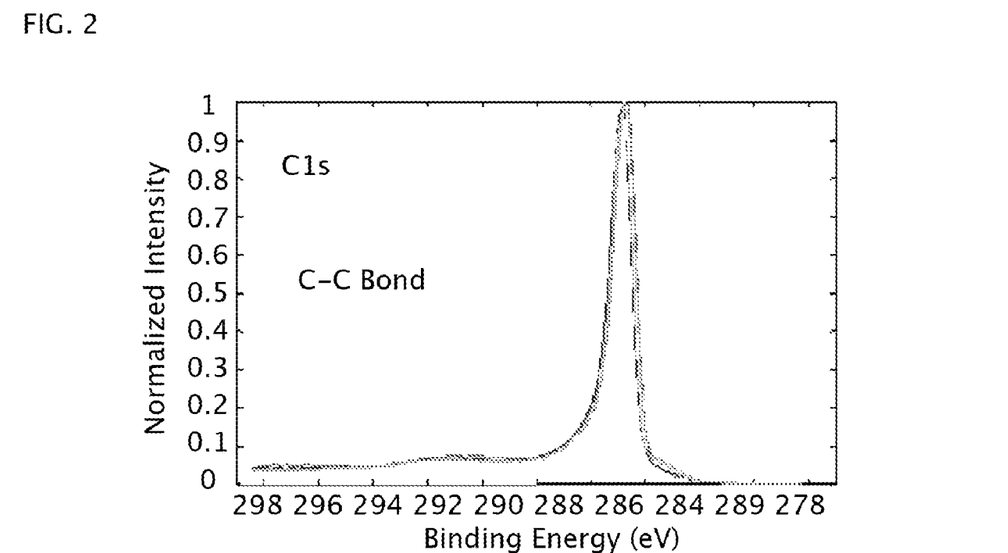
FIG. 2 is a chart showing a result of elemental analysis on the surface of silicon carbide processed by a graphitization treatment measured by an angle resolved X-ray photoelectron spectroscopy (XPS)

Next, a heat treatment was conducted using a furnace that allows controlling temperature to at least 1,500° C. and a pressure of in the range of 2 to 760 Torr, and is capable of introduction of $SiH_4$ and argon gases. First, a process for evaporating silicon atoms from the SiC surface (a graphitization treatment) was conducted. The heat treatment process in this embodiment was carried out in an argon atmosphere at a temperature of 1,700° C. and a pressure of 3.7 Torr for 5 minutes. FIG. 2 shows the result of an elemental analysis on the SiC surface treated by the graphitization treatment obtained by means of an angle resolved X-ray photoelectron spectroscopy (XPS). FIG. 2, showing C1s peaks, indicates only a peak of a bonding energy of 285 eV, which demonstrates the C—C bond. This peak is that of graphite, confirming that silicon atoms have been removed from the SiC surface. FIG. 2 indicates four curves measured at the angles of 5°, 30°, 60°, and 90°. The curve obtained by 5° measurement indicates the condition on the outermost surface. Table 1 shows atomic compositions of silicon, carbon, and oxygen obtained from the XPS data shown in FIG. 2. While the XPS gives data in the vicinity of the surface, Table 1 indicates that the carbon fraction is higher in a position near to the outermost surface. The data of 90° incidence still indicated at least 96.9% of carbon. Thus, it has been demonstrated that the SiC surface (at least down to several nm) has mostly been transformed into graphite.

TABLE 1

| | Composition of Graphitized SiC Surface | | | |
|---|---|---|---|---|
| | C | O | Si | depth of measurement relative to the one at 90° |
| 5° | 98.2 | 1.0 | 0.8 | 0.09 |
| 30° | 98.4 | 0.7 | 0.9 | 0.50 |
| 60° | 96.7 | 0.5 | 2.8 | 0.87 |
| 90° | 96.9 | 0.5 | 2.7 | 1.00 |

Figure 1A:
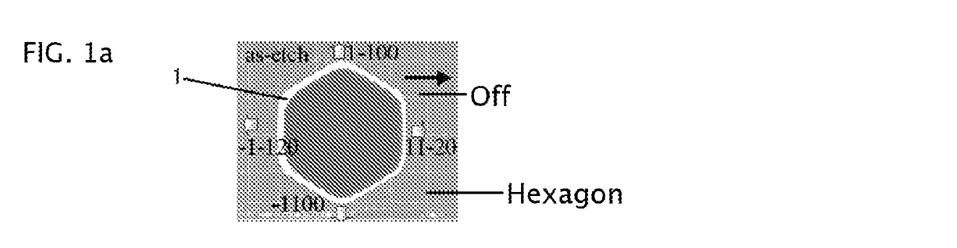
FIGS. 1(a) through 1(c) are electron micrographs of a surface of a silicon carbide semiconductor device of an embodiment according to the present invention.
Figure 1B:
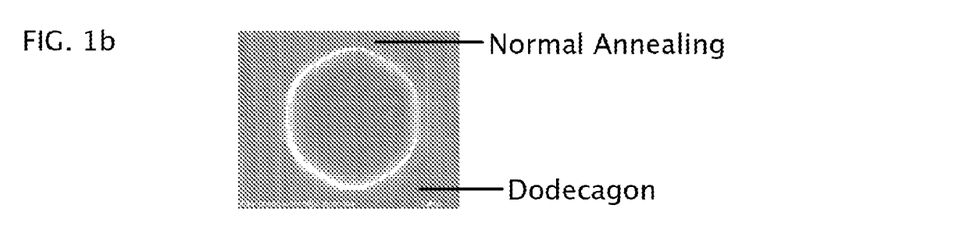
Figure 1C:
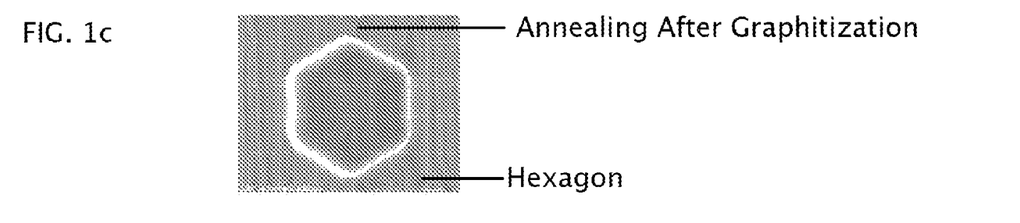
Figure 3A:
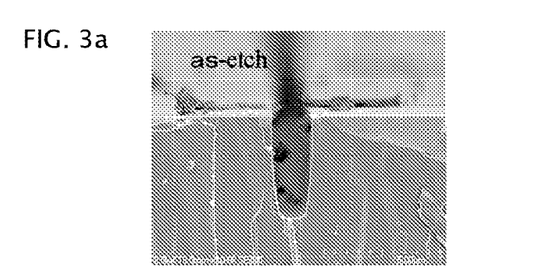
FIGS. 3(a) through 3(c) are electron micrographs of a cross section surface of a silicon carbide substrate to observe a configuration of a trench corner.
Figure 3B:
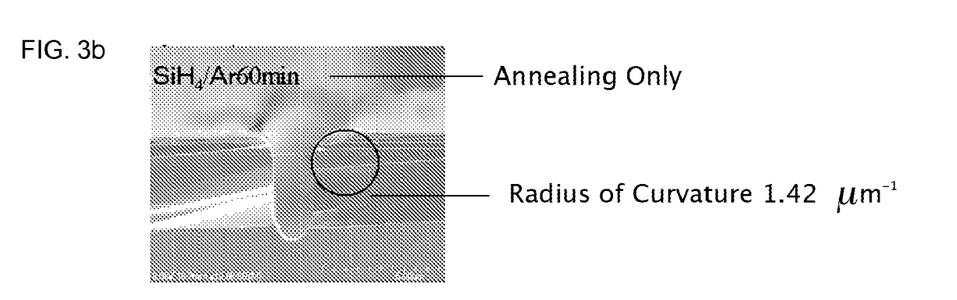
Figure 3C:
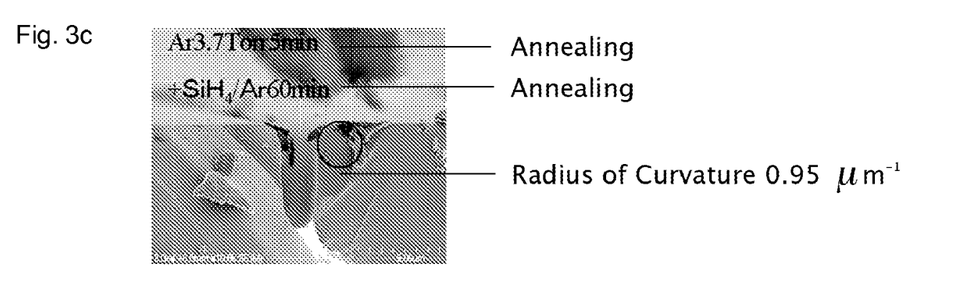

Then, a heat treatment process is conducted for deforming the surface of the graphitized SiC. The conditions were: an $SiH_4$/argon mixed gas containing 0.09% of $SiH_4$, a temperature of 1,700° C., a pressure of 80 Torr, and a duration of 60 minutes. The duration of a rather long time of 60 minutes was to signify the difference in deformation before and after the heat treatment process. FIGS. 1(a) through 1(c) are electron micrographs to check occurrence of deformation before and after the heat treatment and with and without graphitization treatment in the etched configuration of a hexagon. The etched configuration was a hexagon before the heat treatment as shown in FIG. 1(a). The configuration was deformed to a dodecagon in the case of a heat treatment without the graphitization treatment, as shown in FIG. 1(b). The configuration stayed in a hexagon in the case of heat treatment after the graphitization treatment as shown in FIG. 1(c). FIGS. 3(a) through 3(c) are electron micrographs to check change of the configuration at the trench corner of the trench cross section with and without the graphitization treatment. FIG. 3(a) shows the cross section before the heat treatment. FIG. 3(b) shows a heat treated configuration without the graphitization treatment. A measured radius of curvature at the corner of the trench opening was 1.42 μm. A radius of curvature at the corner of the trench opening heat treated after the graphitization treatment was 0.95 μm as indicated in FIG. 3(c). It has been thus demonstrated that deformation of SiC due to the heat treatment is suppressed by graphitizing the surface of the SiC substrate. This technique can retain a small radius of curvature at the corner of the trench opening still after a heat treatment at a temperature of not lower than 1,500° C. for a long time, thus suppressing deformation of the trench configuration.

Second Embodiment

The following describes a manufacturing method to promote deformation at an etching part such as a trench formed in SiC by a high temperature heat treatment with reference to the accompanying drawings. After thoroughly cleaning a substrate having a crystal structure of 4H—SiC with an 8 degrees off C plane (or a substrate of 4H—SiC with an 8 degrees off C plane having an SiC epitaxial film), an $SiO_2$ film 2.5 μm thick was deposited on the substrate by means of a plasma CVD method. The deposition process was carried out using a deposition gas of $SiH_4+O_2+Ar$ under a pressure of 50 Pa and a VHF power at 60 MHz of 500 W at a substrate heating temperature of 400° C. The substrate after the deposition process was cleaned and a resist was applied on the $SiO_2$ film by a coater. After that, an exposure process was conducted using a reticle having a pattern of trenches, circles, and hexagons by means of a stepper apparatus. A development process was conducted after the exposure process. After checking precise patterning, a baking process was further conducted at 143° C. for 1 minute using a coater-developer in order to improve resistance to RIE etching of the resist. A thickness of the resist was about 2.5 μm.

Figure 4A:
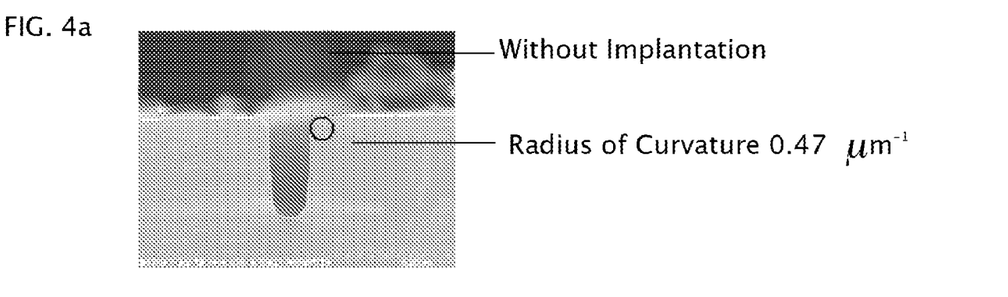
FIGS. 4(a) through 4(c) are electron micrographs of a cross section of a silicon carbide substrate to observe a configuration of a trench corner.
Figure 4B:
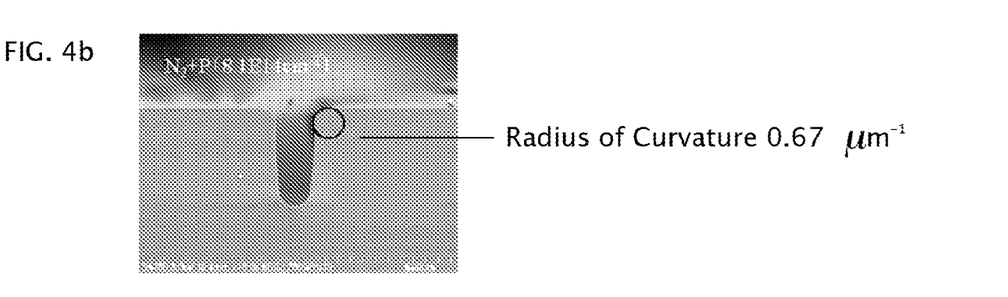
Figure 4C:
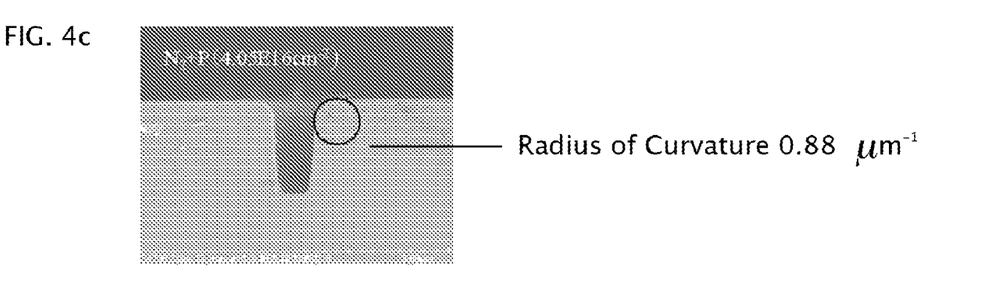
Figure 5:
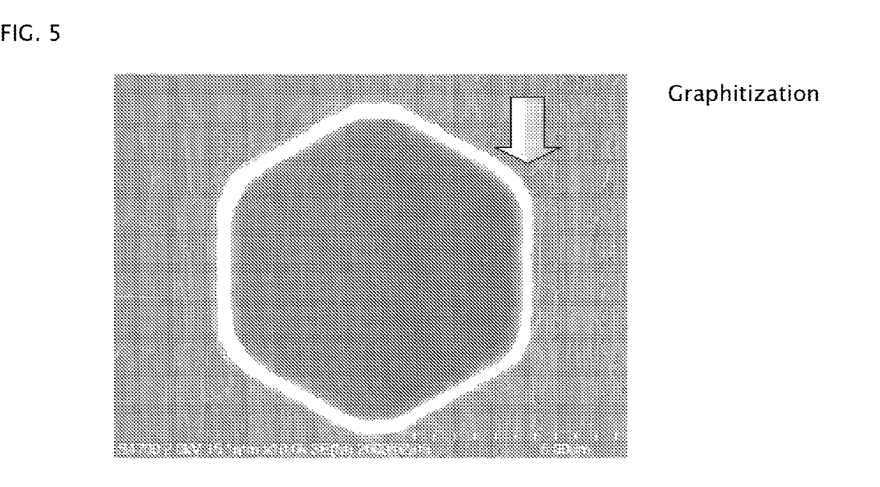
FIG. 5 is an electron micrograph of a surface of a silicon carbide semiconductor device to observe deformation after a heat treatment.
Figure 6:
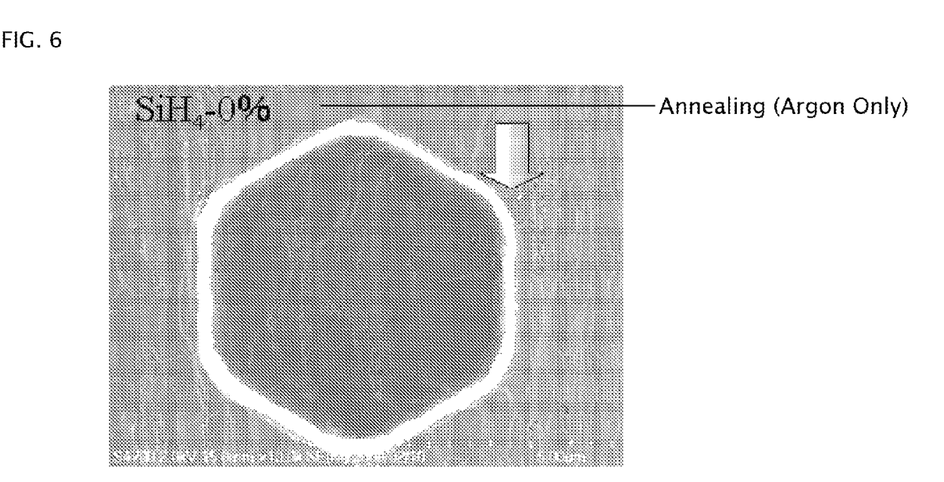
FIG. 6 is an electron micrograph of a surface of a silicon carbide semiconductor device to observe deformation after a heat treatment.

Then, a dry etching process was conducted on the $SiO_2$ film using a mask of the resist by means of an RIE etching apparatus. Etching conditions were: an etching gas of a mixed gas of $CHF_3$/argon=10/10 sccm, a pressure of 3 Pa, and an RF power of 75 W. An ashing process was conducted after the etching process to remove the remained resist, in the conditions of: a mixed gas of $CHF_3/O_2$=4/100 sccm, a pressure of 150 Pa, and an RF power of 150 W. After the ashing process, the resist was immersed in a stripper solution to thoroughly remove the resist; the substrate was immersed in isopropyl alcohol, washed with pure water, and dried. The thus fabricated $SiO_2$ pattern was used for etching the SiC. The etching process on the SiC was carried out using an SiC etching apparatus utilizing ICP in the conditions of ICP power of 450 W, a bias power of 8 W, an etching gas of $SF_6/O_2/Ar$=8.5/1.5/50 sccm, and a pressure of 2 Pa. Etching depth was in the range from 3.5 μm to 4.5 μm. After the etching process, the remained $SiO_2$ film was removed. Then, an ion implantation process was conducted on the SiC substrate using an ion implantation apparatus. The ion implantation process was conducted injecting only to a place to promote deformation. Places unnecessary of the injection are preliminarily covered with an $SiO_2$ film having a thickness of at least 2 μm. After completion of the ion implantation process, the $SiO_2$ was removed. Then, a heat treatment was conducted using a furnace that allows controlling a temperature of at least 1,500° C. and a pressure in the range of 2 to 760 Torr, and is capable of introduction of $SiH_4$ and argon gases. The heat treatment process in this embodiment was carried out in an atmosphere of argon containing 0.09% of $SiH_4$ at a temperature of 1,700° C. and a pressure of 80 Torr for 10 minutes. FIGS. 4(a) through 4(c) show a cross sectional configuration of the trench after a heat treatment in an atmosphere of argon containing 0.09% of $SiH_4$ at a temperature of 1,700° C. and a pressure of 80 Torr for 10 minutes. FIG. 4(a) is for a case of no injection, FIG. 4(b) is for an injection of nitrogen and phosphorus ions in a dose amount of $8.1 \times 10^{14}$ cm$^{-2}$, and FIG. 4(c) is for injection in a dose amount of $4.05 \times 10^{16}$ cm$^{-2}$. A radius of curvature at the corner of the trench opening was 0.47 μm for the no injection case (FIG. 4(a)). The radius of curvature was 0.67 μm in the case of injection of nitrogen and phosphorus ions in a dose amount of $8.1 \times 10^{14}$ cm$^{-2}$ followed by a heat treatment as indicated in FIG. 4(b). The radius of curvature increased to 0.88 μm when the dose amount was increased to $4.05 \times 10^{16}$ cm$^{-2}$ as indicated in FIG. 4(c). Thus, ion implantation into the surface of an SiC substrate promotes deformation of SiC. This technique can increase the radius of curvature at the corner of the trench opening still by a heat treatment in a short time. A part of large deformation can be created in one substrate (a device element) by injection only into a necessary specific place.

Third Embodiment

A method, different from the method of Second Embodiment, for promoting deformation at an etching part such as a trench formed on SiC by a high temperature heat treatment will be described referring to the accompanying pictures. After thoroughly cleaning a substrate having a crystal structure of 4H—SiC with an 8 degrees off C plane (or a substrate of 4H—SiC with an 8 degrees off C plane having an SiC epitaxial film), an $SiO_2$ film 2.5 μm thick was deposited on the substrate by means of a plasma CVD method. The deposition process was carried out using a deposition gas of $SiH_4+O_2+Ar$ under a pressure of 50 Pa and a VHF power at 60 MHz of 500 W at a substrate heating temperature of 400° C. The substrate after the deposition process was cleaned and a resist was applied on the SiO$_2$ film by a coater. After that, an exposure process was conducted using a reticle having a pattern of trenches, circles, and hexagons by means of a stepper apparatus. A development process was conducted after the exposure process. After checking precise patterning, a baking process was further conducted at 143° C. for 1 minute using a coater-developer in order to improve resistance to RIE etching of the resist. A thickness of the resist was about 2.5 μm.

Figure 7:
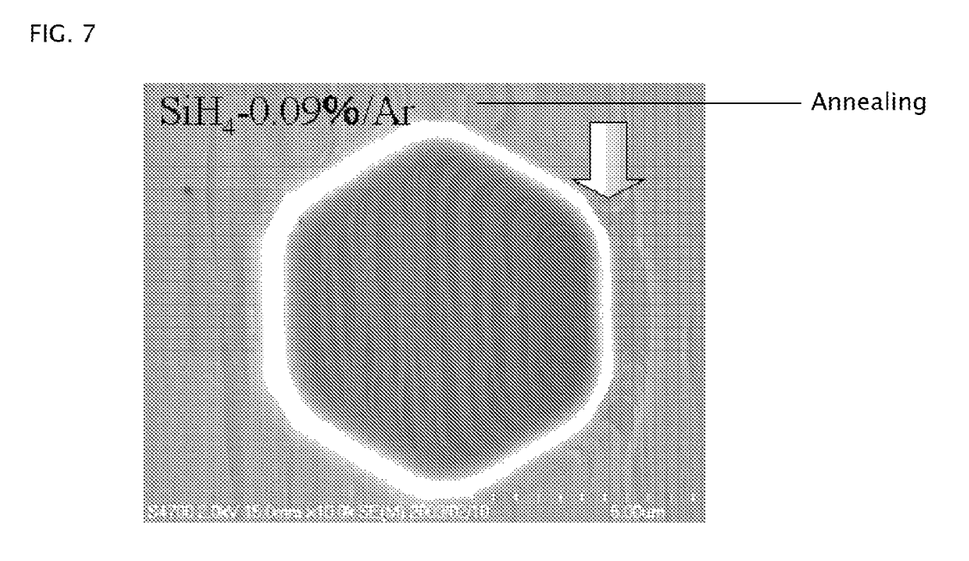
FIG. 7 is an electron micrograph of a surface of a silicon carbide semiconductor device to observe deformation after a heat treatment.
Figure 8:
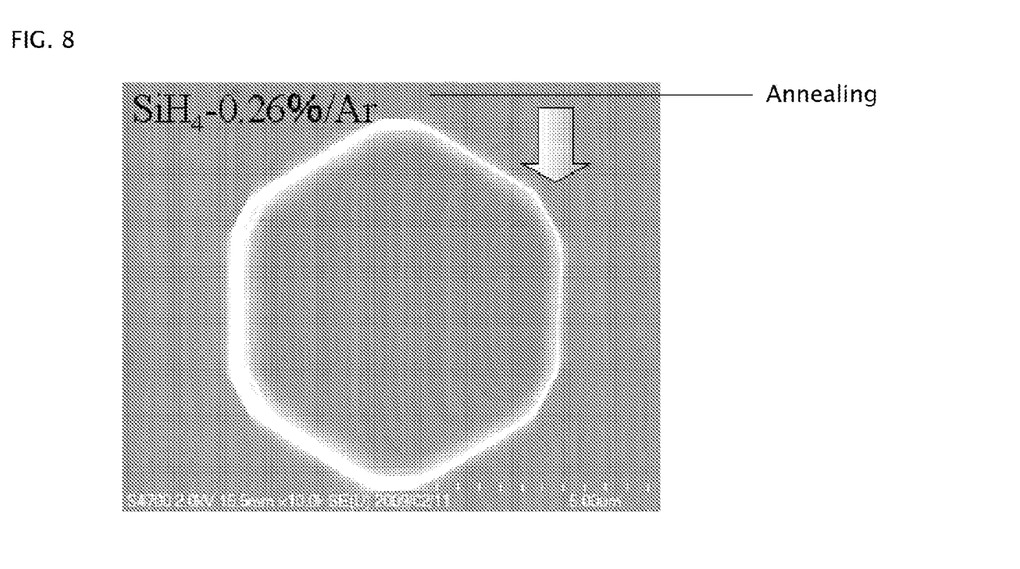
FIG. 8 is an electron micrograph of a surface of a silicon carbide semiconductor device to observe deformation after a heat treatment.
Figure 9:
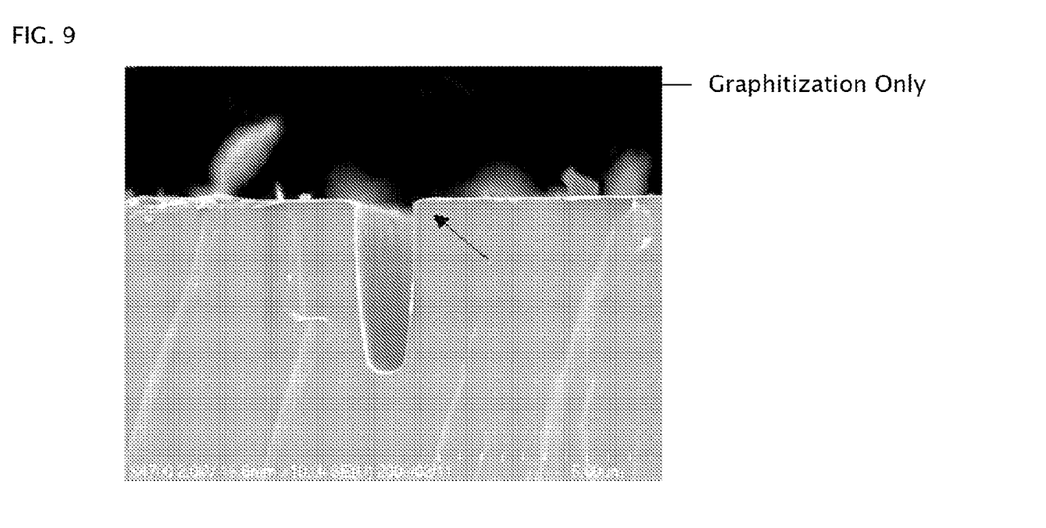
FIG. 9 is an electron micrograph of a cross section of a silicon carbide substrate to observe deformation of the configuration at the trench corner.
Figure 10:
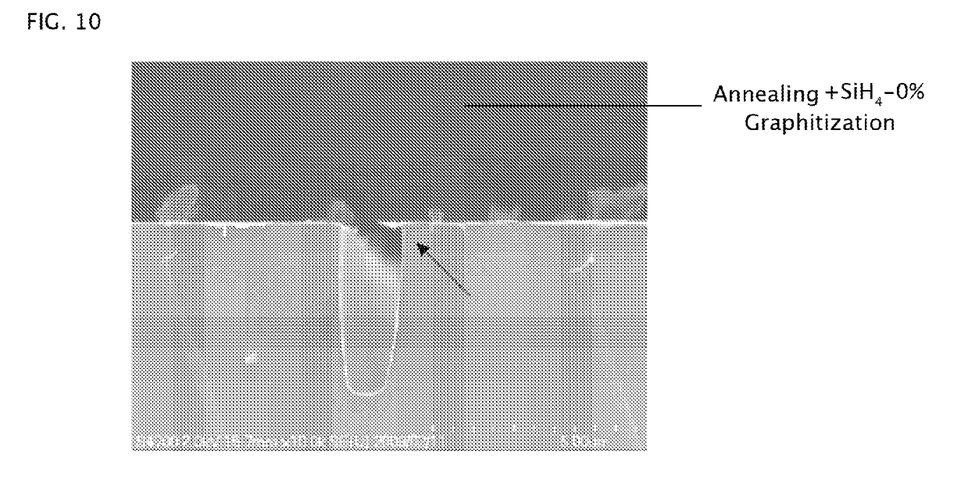
FIG. 10 is an electron micrograph of a cross section of a silicon carbide substrate to observe deformation of the configuration at the trench corner.
Figure 11:
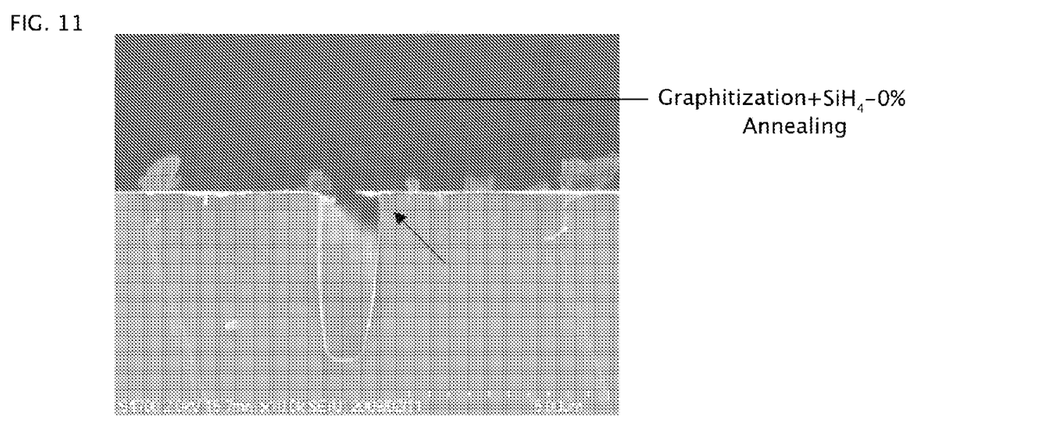
FIG. 11 is an electron micrograph of a cross section of a silicon carbide substrate to observe deformation of the configuration at the trench corner.
Figure 12:
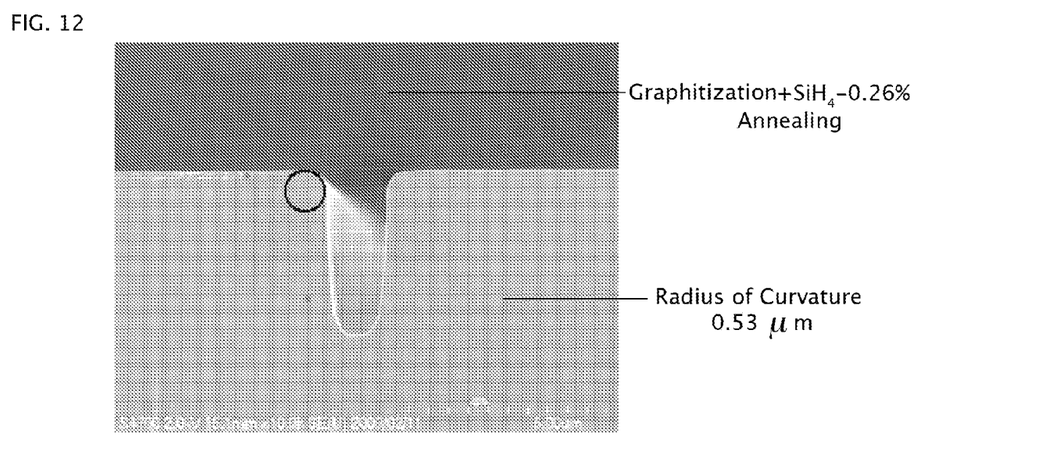
FIG. 12 is an electron micrograph of a cross section of a silicon carbide substrate to observe deformation of the configuration at the trench corner.

Then, a dry etching process was conducted on the SiO$_2$ film using a mask of the resist by means of an RIE etching apparatus. Etching conditions were: an etching gas of a mixed gas of CHF$_3$/argon=10/10 sccm, a pressure of 3 Pa, and an RF power of 75 W. An ashing process was conducted after the etching process to remove the remained resist, in the conditions of: a mixed gas of CHF$_3$/O$_2$=4/100 sccm, a pressure of 150 Pa, and an RF power of 150 W. After the ashing process, the resist was immersed in a stripper solution to thoroughly remove the resist; the substrate was immersed in isopropyl alcohol and washed with pure water, and dried. The thus fabricated SiO$_2$ pattern was used for etching the SiC. The etching process on the SiC was carried out using an SiC etching apparatus utilizing ICP in the conditions of ICP power of 450 W, a bias power of 8 W, an etching gas of SF$_6$/O$_2$/Ar=8.5/1.5/50 sccm, and a pressure of 2 Pa. Etching depth was in the range from 3.5 μm to 4.5 μm. After the etching process, the remained SiO$_2$ film was removed. Then, a heat treatment process was conducted using a furnace allowing a high temperature of at least 1,500° C. controlling a pressure in the range of 2 to 760 Torr, and is capable of introduction of SiH$_4$ and argon gases. First, a treatment for evaporating silicon atoms from the SiC surface (a graphitizing treatment) was conducted. In this embodiment, the heat treatment was conducted in an atmosphere of argon at a pressure of 3.7 Torr at a temperature of 1,700° C. for 5 min. Then, a heat treatment was carried out in an atmosphere of argon containing SiH$_4$ in an amount of from 0% to 0.26% at a temperature of 1,700° C. and a pressure of 80 Torr for 10 minutes. FIGS. 5 through 8 are electron micrographs of an SiC substrate processed by a graphitizing treatment after the hexagonal etching (FIG. 5), a heat treatment in argon gas without an additive of SiH$_4$ (FIG. 6), a heat treatment in argon gas containing 0.09% of SiH$_4$ (FIG. 7), and a heat treatment in argon gas containing 0.26% of SiH$_4$ (FIG. 8). In comparison with a basic configuration that is the one processed by only a graphitizing treatment (FIG. 5), SiC substrate heat treated in argon gas without an additive of SiH$_4$ (FIG. 6) generated no significant deformation, while the substrate heat treated in argon gas with an additive of 0.09% SiH$_4$ created deformation at the corners of the hexagon (FIG. 7). The substrate heat treated in argon gas with an additive of 0.26% SiH$_4$ tends to deform towards a dodecagon. FIGS. 9 through 12 are electron micrographs of a cross section of the trench. A radius of curvature at the corner of the trench opening in the substrate heat treatment in an argon gas without an addition of SiH$_4$ is extremely small, that is, the corner has a configuration of a sharp right angle and no significant deformation is seen, as apparent in FIG. 9 and FIG. 10. The substrate heat treated in argon gas containing 0.09% SiH$_4$ has a rounded corner and a radius of curvature is 0.38 μm as indicated in FIG. 11. The substrate heat treated in argon gas containing 0.26% of SiH$_4$ has a radius of curvature increased to 0.53 μm, as indicated in FIG. 12. Although the graphitization treatment should make the SiC hardly deformed, the deformation of SiC can be promoted by adding 0.26% of SiH$_4$ in the heat treatment process. This technique can increase a radius of curvature at the corner of the trench opening still by a heat treatment in a short time.

As described thus far, the method of manufacturing a silicon carbide semiconductor device is useful for manufacturing a power semiconductor devices having a trench structure or a hole.

Thus, a silicon carbide semiconductor device has been described according to the present invention. Many modifications and variations may be made to the techniques and structures described and illustrated herein without departing from the spirit and scope of the invention. Accordingly, it should be understood that the methods and devices described herein are illustrative only and are not limiting upon the scope of the invention.

What is claimed is:

1. A method of manufacturing a silicon carbide semiconductor device comprising:
    forming a trench or a hole on a silicon carbide semiconductor substrate or a substrate having a silicon carbide epitaxial layer formed thereon by an etching process, and heat treating at a temperature of 1,500° C. or higher;
    wherein the heat treating uses an argon atmosphere at a temperature in a range of 1,600° C. to 1,800° C. under a pressure of at most 10 Torr for a time duration in a range of 0.1 min to 10 min to evaporate silicon atoms from a surface of the silicon carbide semiconductor substrate or the silicon carbide epitaxial layer and to obtain a silicon carbide surface with a carbon atom concentration of at least 95%.

2. A method of manufacturing a silicon carbide semiconductor device comprising:
    forming a trench or a hole on a silicon carbide semiconductor substrate or a substrate having a silicon carbide epitaxial layer formed thereon by an etching process, and heat treating at a temperature of 1,500° C. or higher;
    the method further comprising a step of ion implantation of nitrogen ions or phosphorus ions in a dose amount of $8 \times 10^{14}$ cm$^{-2}$ into a surface of the silicon carbide semiconductor substrate or into the silicon carbide epitaxial layer, followed by the heat treating at a temperature of 1,500° C. or higher.

3. A method of manufacturing a silicon carbide semiconductor device comprising:
    forming a trench or a hole on a silicon carbide semiconductor substrate or a substrate having a silicon carbide epitaxial layer formed thereon by an etching process, and heat treating at a temperature of 1,500° C. or higher;
    wherein the heat treating comprises heat treating in an atmosphere of argon gas at a temperature in a range of 1,600° C. to 1,800° C. containing monosilane in an amount of at least 0.2%.

* * * * *